(12) United States Patent
Nansei et al.

(10) Patent No.: US 7,879,670 B2
(45) Date of Patent: Feb. 1, 2011

(54) METHOD OF MANUFACTURING NONVOLATILE STORAGE DEVICE

(75) Inventors: Hiroyuki Nansei, Kanagawa (JP); Toshiharu Tanaka, Mie (JP); Hirokazu Kikuchi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/554,319

(22) Filed: Sep. 4, 2009

(65) Prior Publication Data

US 2010/0261330 A1 Oct. 14, 2010

(30) Foreign Application Priority Data

Apr. 9, 2009 (JP) ............................. 2009-095071

(51) Int. Cl.
*H01L 21/8244* (2006.01)
(52) U.S. Cl. ........................ 438/237; 438/238; 438/382; 257/E21.645
(58) Field of Classification Search .................. 438/237, 438/238, 382; 257/E21.645
See application file for complete search history.

(56) References Cited

U.S. PATENT DOCUMENTS 6,960,495 B2 * 11/2005 Vyvoda et al. .............. 438/131

| | | | |
|---|---|---|---|
| 2007/0132049 A1 | 6/2007 | Stipe | |
| 2008/0318169 A1 | 12/2008 | Taniguchi | |
| 2010/0072454 A1 * | 3/2010 | Aburada et al. ................ | 257/5 |
| 2010/0167462 A1 * | 7/2010 | Lee ............................ | 438/104 |
| 2010/0176488 A1 * | 7/2010 | Aoyama ..................... | 257/536 |

FOREIGN PATENT DOCUMENTS

JP          2009-4535          1/2009

* cited by examiner

*Primary Examiner*—Lex Malsawma
(74) *Attorney, Agent, or Firm*—Oblon, Spivak, McClelland, Maier & Neustadt, L.L.P.

(57) ABSTRACT

A method of manufacturing a nonvolatile storage device having memory cell arrays according to an embodiment of the present invention includes forming, in a memory cell array forming region above a processed film, first columnar members arrayed at substantially equal intervals in the first direction and the second direction, forming, concerning at least arrays as a part of arrays of the first columnar members in the first direction, second columnar members long in section having major axes longer than sections of the first columnar members outside of the memory cell array forming region such that the major axes are set in the first direction and the second columnar members continue to ends of the arrays, and forming, in the same manner as above, third columnar members, which continue to arrays of the first columnar members in the second direction.

20 Claims, 9 Drawing Sheets

METHOD OF MANUFACTURING NONVOLATILE STORAGE DEVICE

CROSS-REFERENCE TO RELATED APPLICATIONS

This application is based upon and claims the benefit of priority from the prior Japanese Patent Application No. 2009-095071, filed on Apr. 9, 2009; the entire contents of which are incorporated herein by reference.

BACKGROUND OF THE INVENTION

1. Field of the Invention

The present invention relates to a method of manufacturing a nonvolatile storage device.

2. Description of the Related Art

Recently, a semiconductor storage device of a resistance change type (resistive random access memory (ReRAM)) that stores information making use of a change in a resistance of a variable resistance element attracts attention. In the ReRAM, a memory cell array is formed by vertically providing columnar structures (pillars), which are formed by laminating variable resistance elements and diodes, at cross points of bit lines and word lines. A reduction in a pitch of the pillars is necessary to advance refining of the ReRAM.

As a technology for the pitch reduction, a sidewall transfer technology for forming a line and space pattern is put to practical use. In the sidewall transfer technology, so-called loop-cut is necessary as treatment of an end of a reduced pitch region. Such treatment of an end could cause a problem in reducing a pitch of the pillars. No technology for reducing a pitch of the pillars is put to practical use. As a method of forming holes in a reduced pitch that are reversed patterns of the pillars, there is a technology proposed in Japanese Patent Application Laid-Open No. 2009-4535. However, the end treatment is not taken into account in this technology.

BRIEF SUMMARY OF THE INVENTION

According to an aspect of the present invention, a method of manufacturing a nonvolatile storage device having memory cell arrays in which memory cells are formed at cross points of a plurality of first wires extending in a first direction and a plurality of second wires extending in a second direction crossing the first direction and held between the first wires and the second wires, the method includes forming, in a memory cell array forming region above a processed film, a plurality of first columnar members having a substantial circular shape or a substantial regular polygonal shape in section arrayed at substantially equal intervals in the first direction and the second direction and arranged in a lattice shape, forming, concerning at least arrays as a part of arrays of the first columnar members in the first direction, second columnar members long in section having major axes longer than sections of the first columnar members outside of the memory cell array forming region such that the major axes are set in the first direction and the second columnar members continue to ends of the arrays, and forming, concerning at least arrays as a part of arrays of the first columnar members in the second direction, third columnar members long in section having major axes longer than the sections of the first columnar members outside of the memory cell array forming region such that the major axes are set in the second direction and the third columnar members continue to ends of the arrays, forming a sidewall film on sidewalls of the columnar members such that hollows are formed in a region surrounded by the columnar members, selectively removing the columnar members, embedding an embedding material in holes formed by removing the columnar members and the hollows to form embedded layers, arranging a resist end to traverse the embedded layers in the holes formed by removing the second and third columnar members, removing the embedded layers on an outer side of the resist end outside of the memory cell array forming region with lithography, and removing the sidewall film, and etching the processed film with the embedded layers as masks to form the memory cells after removing the embedded layers on the outer side and the sidewall film.

DETAILED DESCRIPTION OF THE INVENTION

Exemplary embodiments of the present invention are explained in detail below with reference to the accompanying drawings. The present invention is not limited by the embodiments.

A ReRAM of a cross-point type is explained as an example of a nonvolatile storage device according to this embodiment. This embodiment can also be applied to a NAND memory and the like.

Figure 1:
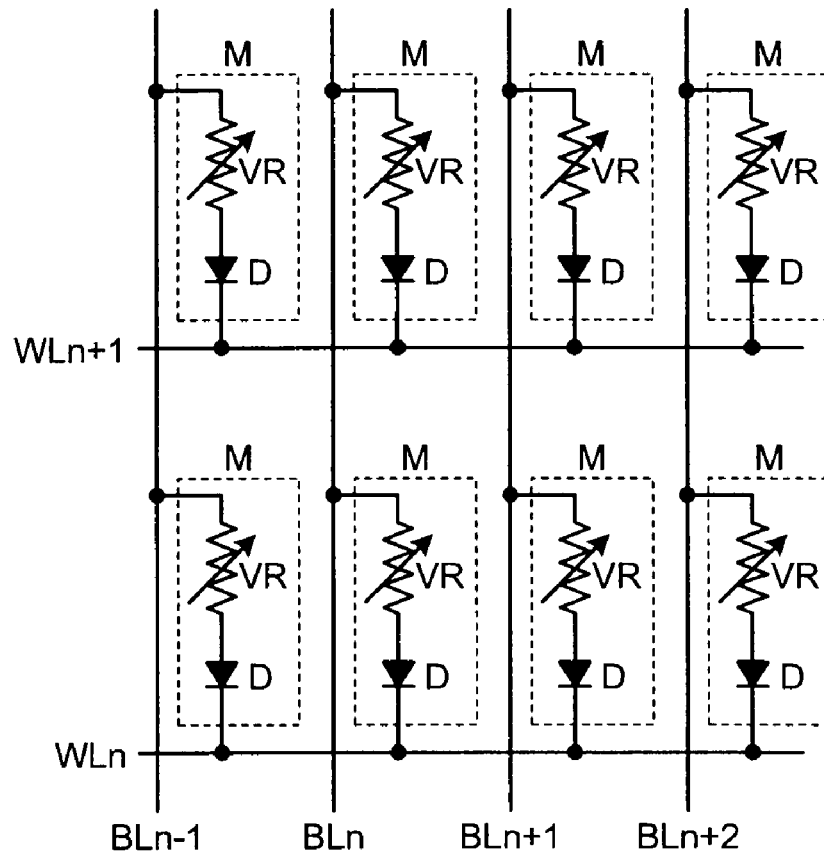
FIG. 1 is a diagram of a configuration of memory cell arrays of a ReRAM according to a first embodiment of the present invention.

FIG. 1 is a diagram of a configuration of memory cell arrays of a ReRAM according to a first embodiment of the present invention. As shown in FIG. 1, in this embodiment, memory cells M, which are formed by laminating rectifying elements D and variable resistance elements VR, are arranged at cross points of a plurality of word lines WL (first wires) and a plurality of bit lines BL (second wires) extended in a row direction and a column direction, respectively. One ends of the variable resistance elements VR are connected to the bit lines BL and the other ends thereof are connected to the word lines WL via the rectifying elements D. The variable resistance elements VR include, for example, a metal oxide film as a resistance change material. The rectifying elements D are diodes including polysilicon as a material.

Figure 2:
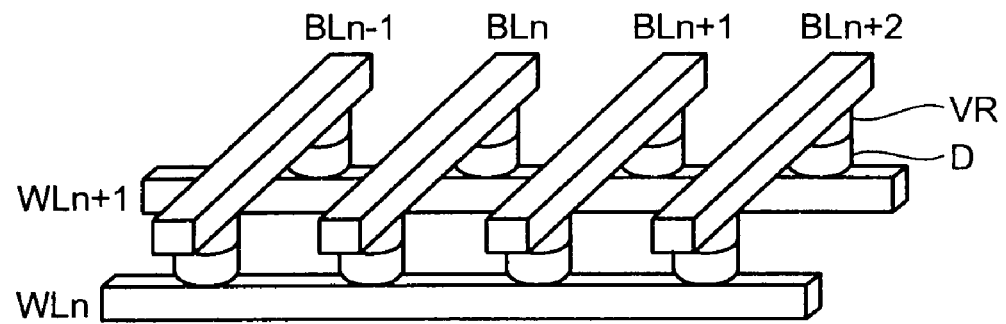
FIG. 2 is a diagram of a three-dimensional laminated structure of the memory cell arrays.

FIG. 2 is a diagram of a three-dimensional laminated structure of the memory cell arrays. As shown in FIG. 2, the bit lines BL and the word lines WL orthogonally arranged vertically spaced apart from each other are connected by columnar structures (pillars) formed by laminating the diodes D and the variable resistance elements VR.

Figure 3:
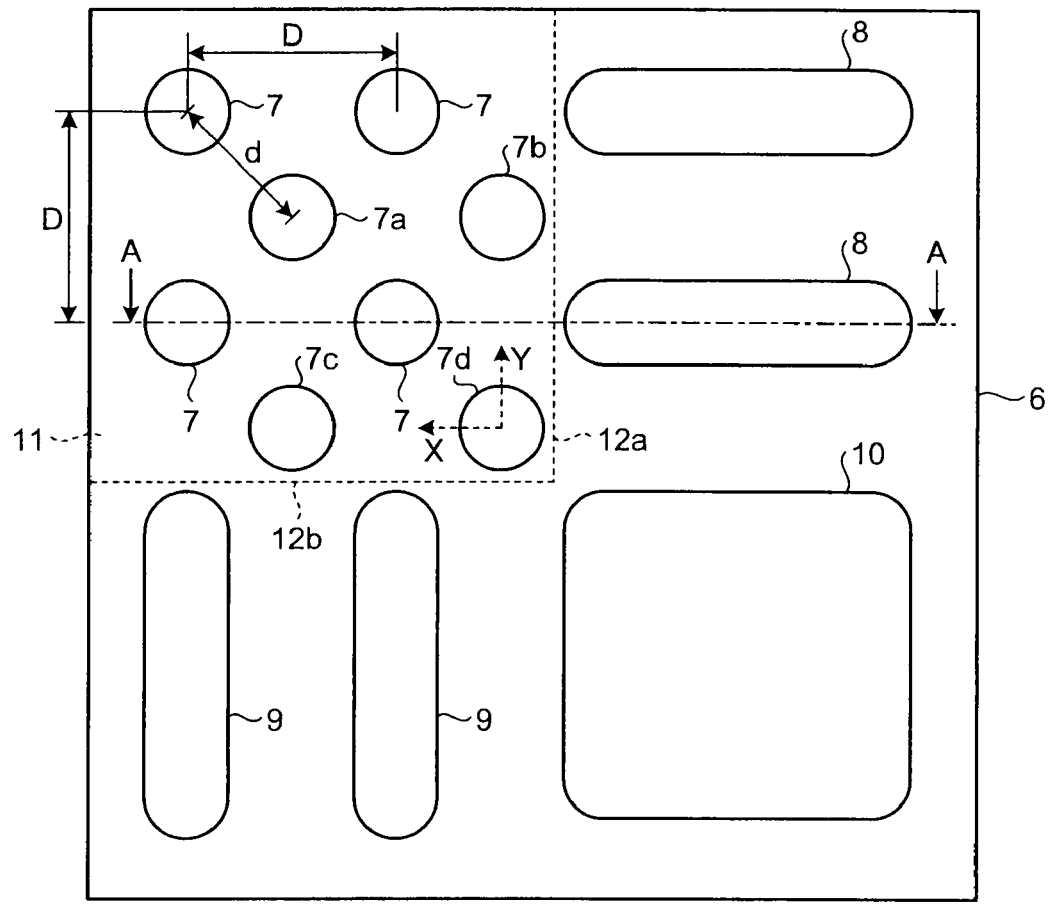
FIG. 3 is a top view of a manufacturing process for a nonvolatile storage device according to the first embodiment.
Figure 4:
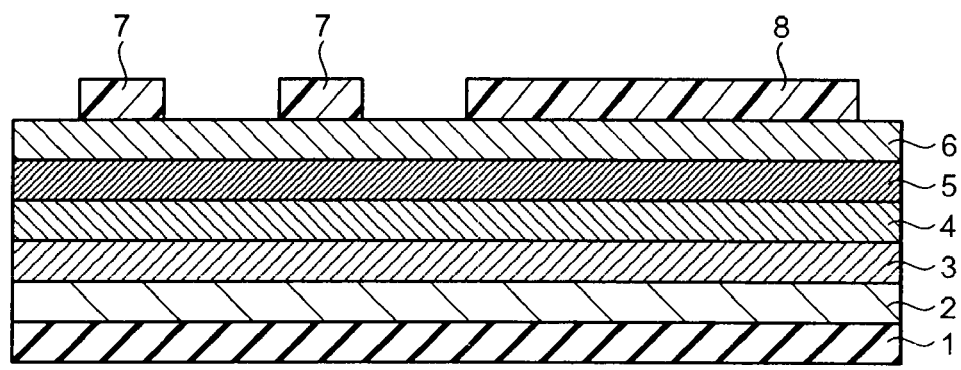
FIG. 4 is a sectional view taken along an A-A line shown in FIG. 3.
Figure 5:
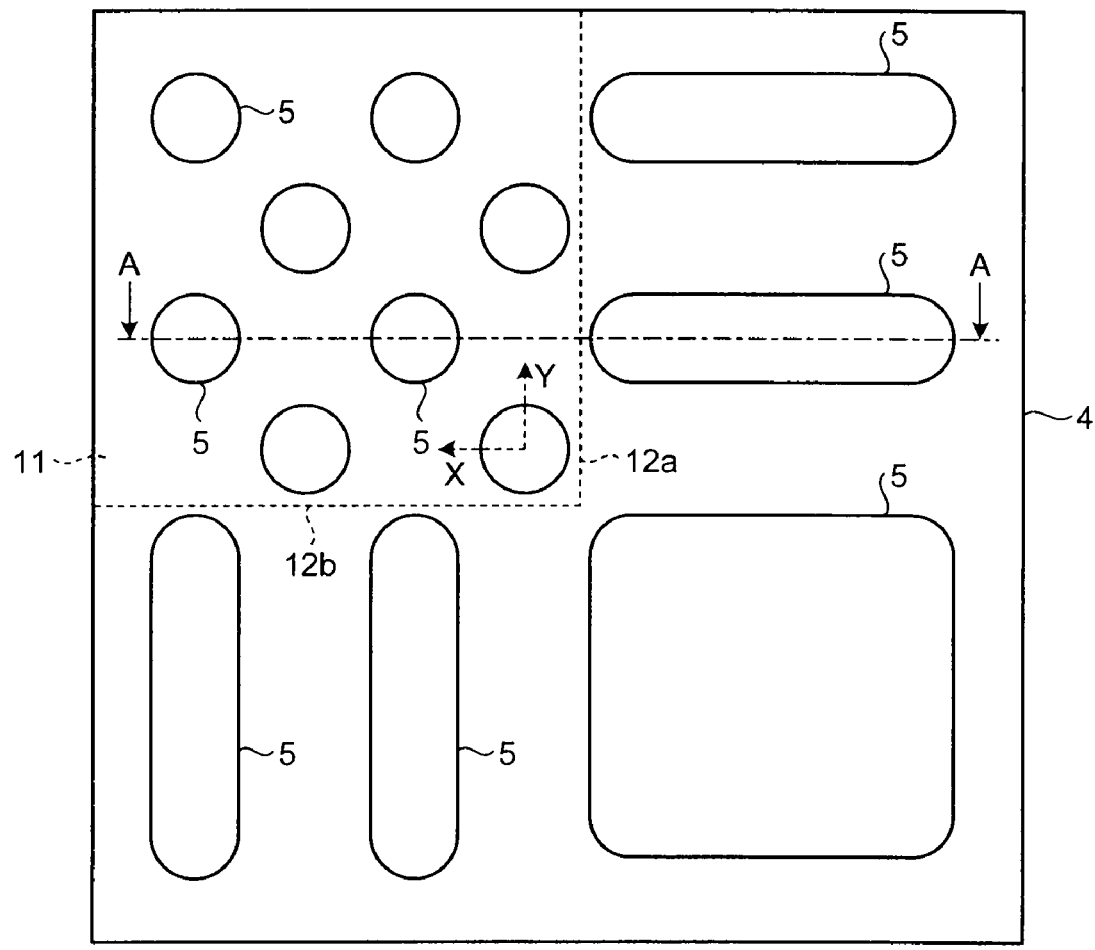
FIG. 5 is a top view of the manufacturing process following FIG. 3.
Figure 6:
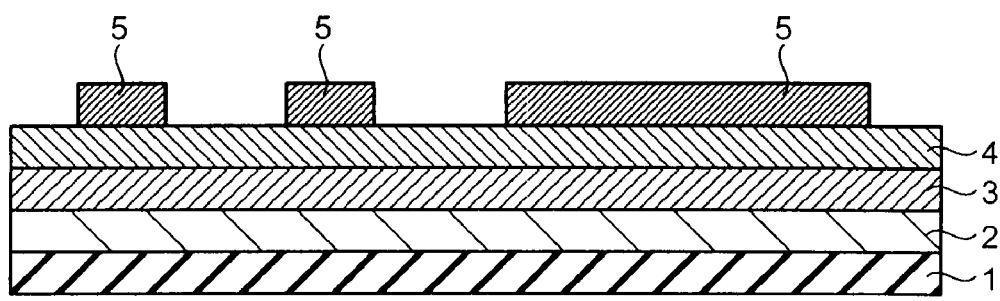
FIG. 6 is a sectional view taken along an A-A line shown in FIG. 5.
Figure 7:
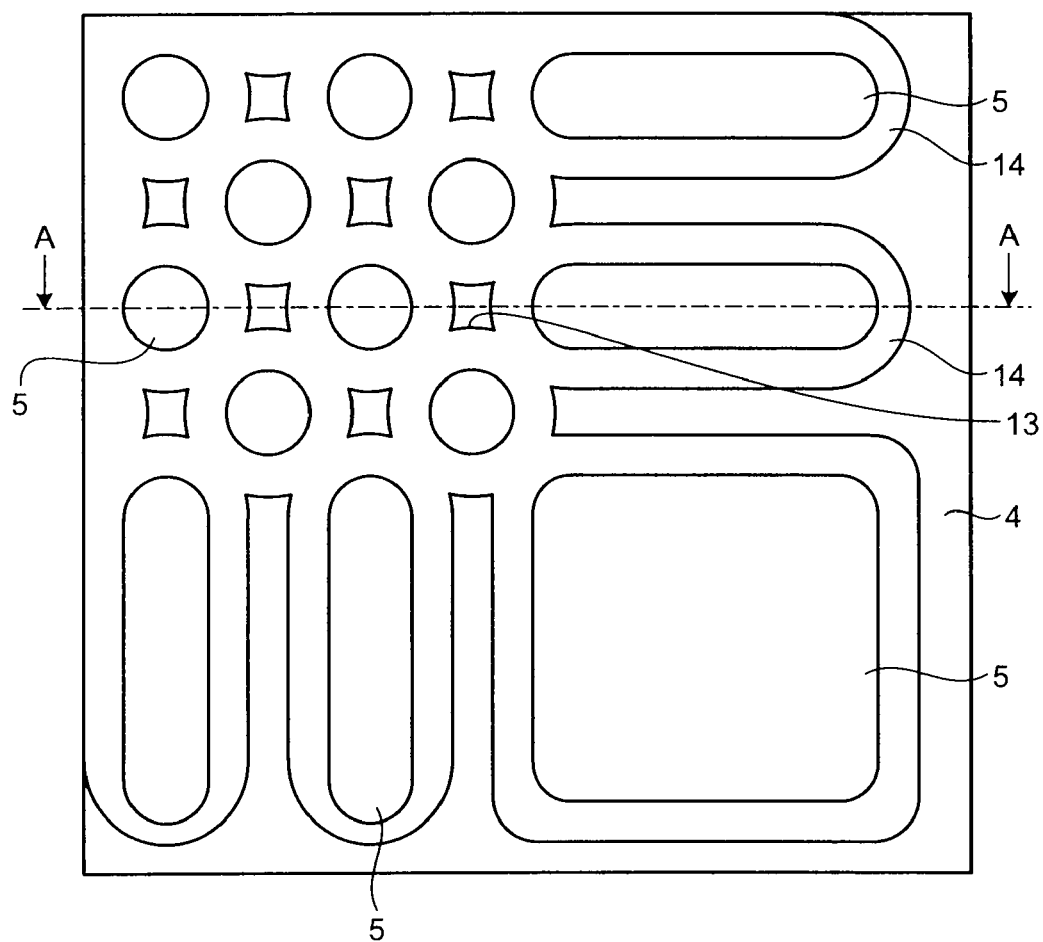
FIG. 7 is a top view of the manufacturing process following FIG. 5.
Figure 8:
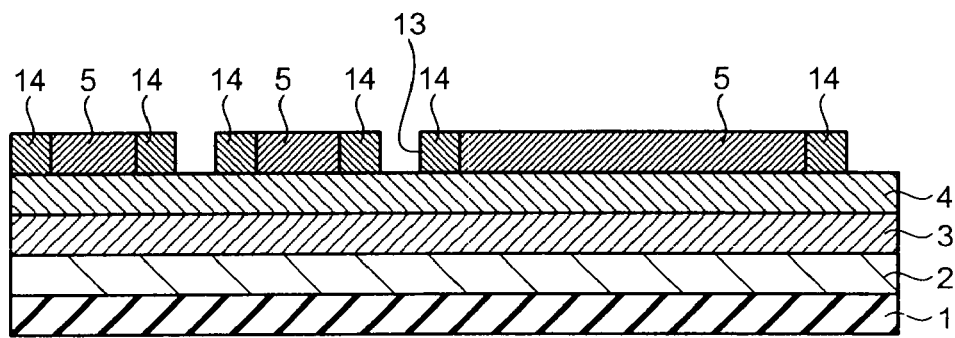
FIG. 8 is a sectional view taken along an A-A line shown in FIG. 7.
Figure 9:
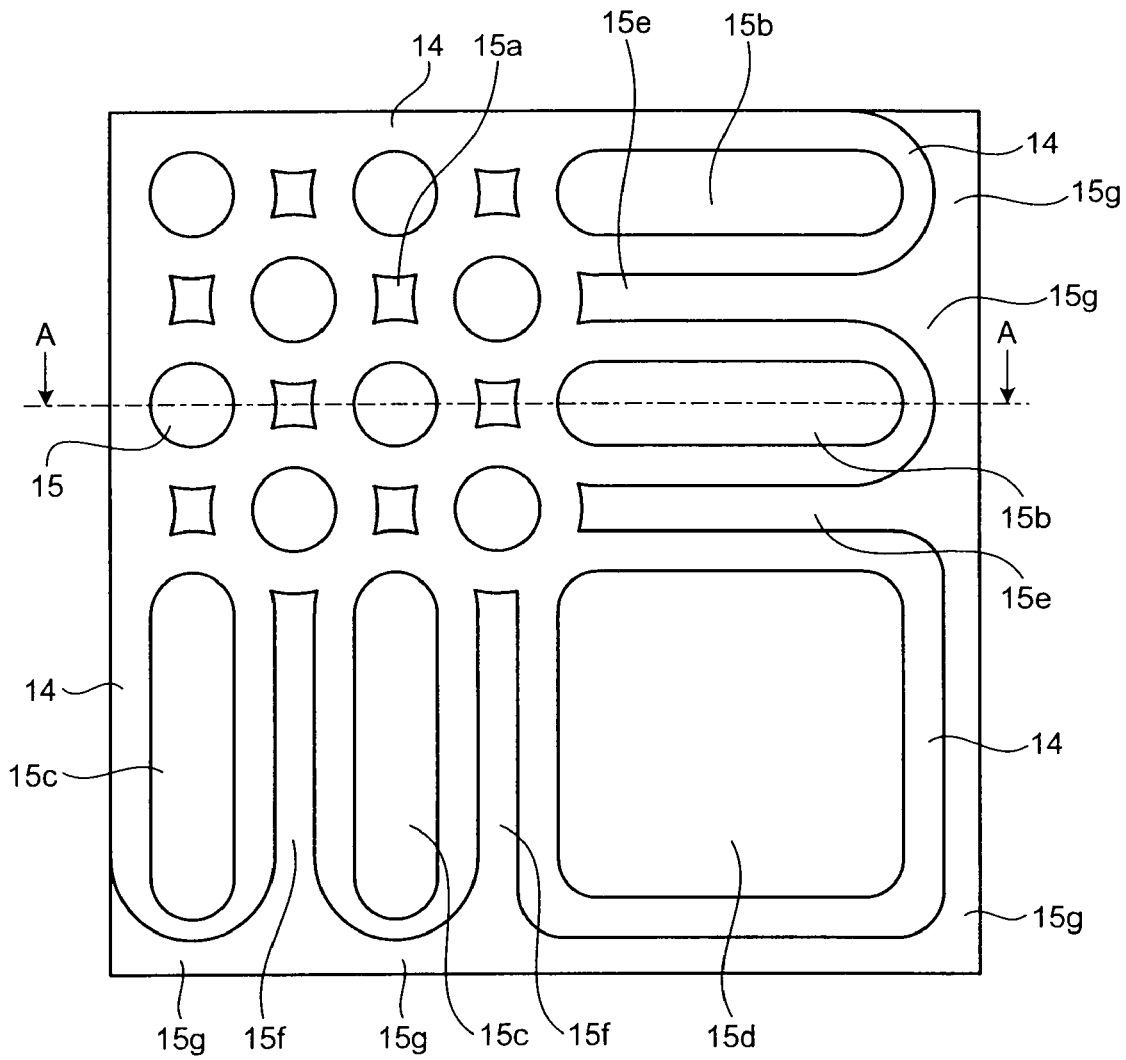
FIG. 9 is a top view of the manufacturing process following FIG. 7.
Figure 10:
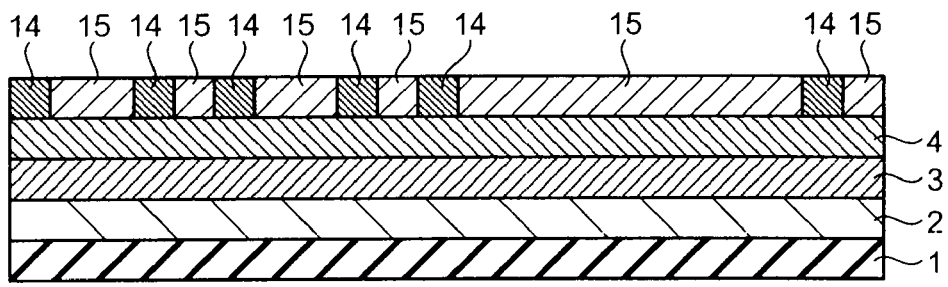
FIG. 10 is a sectional view taken along an A-A line shown in FIG. 9.
Figure 11:
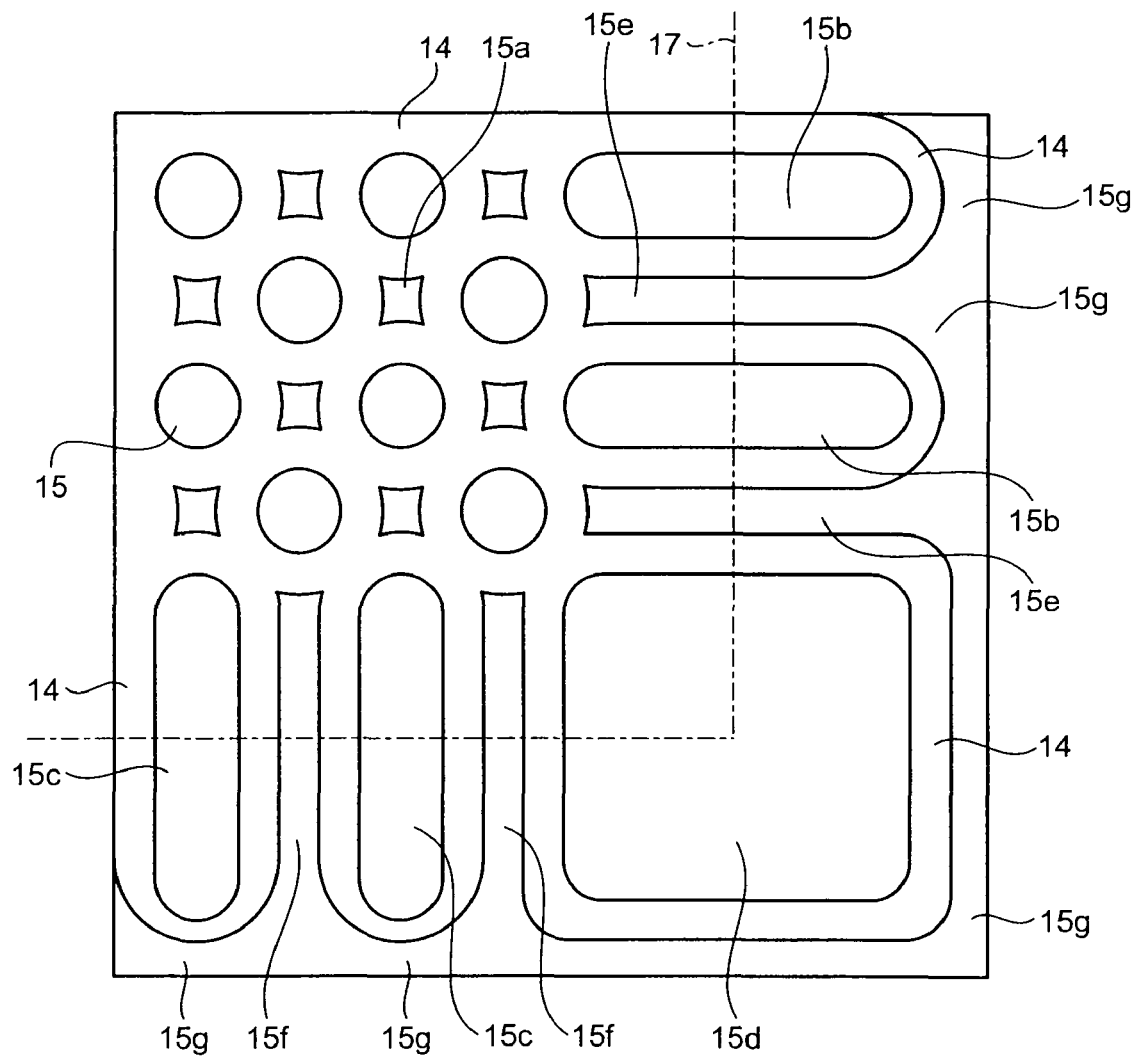
FIG. 11 is a top view of the arrangement of a resist end in FIG. 9.
Figure 12:
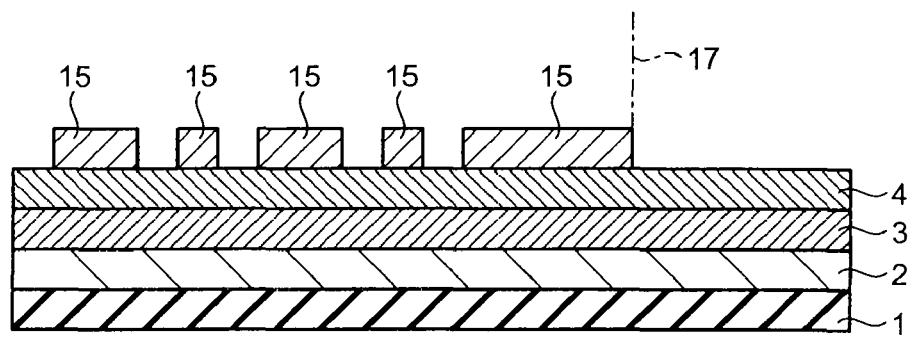
FIG. 12 is a sectional view of the manufacturing process following FIG. 10.
Figure 13:
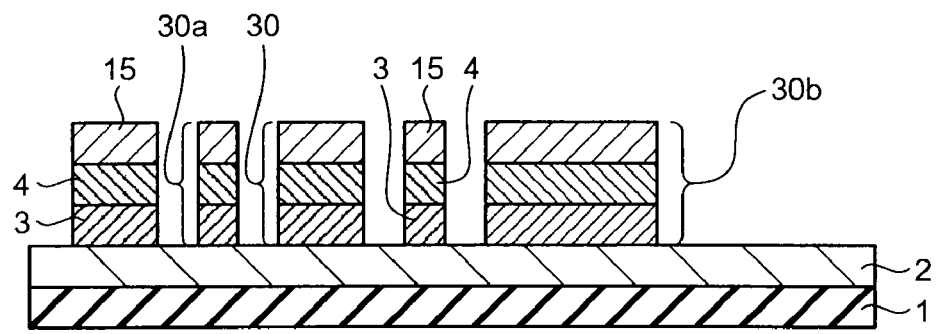
FIG. 13 is a sectional view of the manufacturing process following FIG. 12.

A manufacturing process for ReRAM is explained with reference to FIG. 3 to FIG. 13. FIG. 3 is a top view of a manufacturing process for a nonvolatile storage device according to this embodiment. FIG. 4 is a sectional view taken along an A-A line shown in FIG. 3. FIG. 5 is a top view of the manufacturing process following FIG. 3. FIG. 6 is a sectional view taken along an A-A line shown in FIG. 5. FIG. 7 is a top view of the manufacturing process following FIG. 5. FIG. 8 is a sectional view taken along an A-A line shown in FIG. 7. FIG. 9 is a top view of the manufacturing process following FIG. 7. FIG. 10 is a sectional view taken along an A-A line shown in FIG. 9. FIG. 11 is a top view of the arrangement of a resist end in FIG. 9. FIG. 12 is a sectional view of the manufacturing process following FIG. 10. FIG. 13 is a sectional view of the manufacturing process following FIG. 12.

First, a group of transistors (not shown in the figure) are formed on a semiconductor substrate (not shown in the figure) according to a publicly-known method. Wires (not shown in the figure) for the transistors are formed in a layer on the transistors.

Subsequently, in FIG. 4, an inter-layer insulating film 1 is deposited on the wires. Word lines 2 are formed on the inter-layer insulating film 1 in the publicly-known damascene process. A polysilicon film 3 as a diode is deposited on the inter-layer insulating film 1 on which the word lines 2 are formed. Further, a metal oxide film 4 as a material of variable resistance elements is deposited on the polysilicon film 3. The polysilicon film 3 and the metal oxide film 4 form a processed film. An amorphous carbon (APF) 5 and a silicon nitride film 6 as mask materials are deposited on the metal oxide film 4 in this order. Resists 7 to 10 are formed on the silicon nitride film 6 (FIGS. 3 and 4). The resists 7 to 10 are denoted by the different reference numerals according to differences in shapes. The resists 7 to 10 are separated from one another.

As shown in FIG. 3, a plurality of resists 7 (some of which are referred to as 7a to 7d) having a substantial circular shape are two-dimensionally arranged in a memory cell array forming area 11 on the silicon nitride film 6. Specifically, the resists 7 are arranged on lattice points of imaginary square lattices and on face centers of the lattices. The imaginary square lattices are arrayed at substantially equal intervals D in an X direction (a first direction) and arrayed at the substantially equal intervals D in a Y direction (a second direction) orthogonal to the X direction. For example, the resists 7a, 7b, 7c, and 7d are respectively arranged on the lattice points of the square lattices. One resist 7 on an A-A line is arranged on a face center of these lattice points. A distance $d=D/\sqrt{2}$ between a point on this face center and the respective lattice points is, for example, a minimum space determined by a lithography limit. In FIG. 3, only a part of a memory cell array forming region 11 is shown. Actually, the resists 7 to 10 are formed in the same manner in other regions not shown in the figure. In a relation with the word lines WL and the bit lines BL, for example, the X direction corresponds to the row direction and the Y direction corresponds to the column direction.

Long resists 8 are formed outside of the memory cell array forming region 11 to continue to array ends of the resists 7 arrayed in the X direction. In the example shown in the figure, the resists 8 are formed in, for example, an oval shape. Specifically, instead of arranging the resists 7 in positions at a space D from the array ends, the resists 8 are formed with one ends thereof arranged in the same positions and with major axes thereof set in the X direction. The length of the major axes of the resists 8 is larger than the diameter of the resists 7 and, desirably, larger than the double of the diameter. In FIG. 3, edges 12a and 12b of the memory cell array forming region 11 are shown. The edge 12a is parallel to the Y direction and the edge 12b is parallel to the X direction.

On the other hand, for example, concerning the array in the X direction including the resists 7a and 7b, a resist equivalent to the resist 8 is not formed in a position that continues to an array end. It is determined as explained below whether the resist 8 is formed on an extended line of an array in the X direction. First, as it is seen when both the arrays (i.e., one array including the resists 7a and 7b and the other array, on an extended line of which the resist 8 is formed) are compared in a relation with the edge 12a of the memory cell array forming region 11, a distance from an array end of one array (the center of the resist 7) to the edge 12a is longer than a distance from an array end of the other array (the center of the resist 7b) to the edge 12a. Therefore, concerning the array in which the distance between the array end and the edge 12a is longer (not shorter), the resist 8 is formed.

The array in the Y direction is the same as the array in the X direction. Long resists 9 having, for example, an oval shape are formed outside of the memory cell array forming region 11 to continue to array ends. In the same manner as described above, it is determined based on a distance between the array end and the edge 12b opposed to the array end whether the resist 9 is formed or not.

A resist 10 having, for example, a substantial square shape is formed outside of the memory cell array forming region 11 and in a position opposed to a corner of the memory cell array forming region 11. The length in the X direction of the resist 10 is substantially the same as the length in the X direction of the resist 8. The length in the Y direction of the resist 10 is substantially the same as the length in the Y direction of the resists 9.

The silicon nitride film 6 and the APF 5 are removed by the reactive ion etching (RIE) method with the resists 7 to 10 as masks. At the same time, the resists 7 to 10, which are also made of an organic material, are etched and patterns of the resists 7 to 10 are transferred onto the silicon nitride film 6 and the APF 5. In other words, it is desirable to eliminate the resists 7 to 10 at this stage by adjusting an amount of the etching. Subsequently, the silicon nitride film 6 on the APF 5 is removed by boiling with, for example, phosphoric acid. Consequently, as shown in FIGS. 5 and 6, APFs 5 processed in columnar shapes corresponding to the patterns of the resists 7 to 10 shown in FIG. 3 are formed. Specifically, the APFs 5 formed in the memory cell array forming region 11 are columnar members (first columnar members) having a substantial circular shape in section (or in plan view). The APFs 5 formed outside of the memory cell array forming region 11 are columnar members (second columnar members) long in section, major axes of which extend in the X direction, columnar members (third columnar members) long in section, major axes of which extend in the Y direction, and columnar members (fourth columnar members) having a substantial square shape in section. It is also possible to form the resists 7 shown in FIG. 3 in a substantial regular polygonal shape and form the sections of the APFs 5 formed in the memory cell array forming region 11 in a substantial regular polygonal shape.

A silicon nitride film is deposited for a sidewall on the metal oxide film 4 on which the patterns of the APFs 5 are formed. The silicon nitride film is etched back to leave a sidewall film 14 including the silicon nitride film only on the sidewalls of the APFs 5 as core materials (FIGS. 7 and 8). As shown in FIGS. 7 and 8, it is seen that hollows 13 are formed in gaps of the sidewall film 14. For example, in a region surrounded by the first columnar members (the APFs 5), the hollows 13 having a substantial square shape in plan view are formed in the gaps of the sidewall film 14. Although not denoted by a reference numeral, for example, hollows having a groove shape extending in the X direction are formed between the second columnar members (the APFs 5). In other words, the sidewall film 14 is formed such that the hollows 13 are formed in the regions surrounded by the APFs 5 as the core materials.

The APFs 5 are selectively removed by ashing. Subsequently, in places where the APFs 5 are removed (i.e., columnar holes (not shown in the figure)), the hollows 13, and the like, after barrier metal films of titanium nitride (TiN) or the like are formed, a metal material such as tungsten (W) is embedded to form metal layers 15 as embedded layers. Further, upper surfaces of the metal layers 15 are planarized by the chemical mechanical polishing (CMP) (FIG. 10).

As shown in FIG. 9, the columnar metal layers 15 having a substantial circular shape in section and metal layers 15a embedded in the hollows 13 are formed. On the other hand, outside of the memory cell array forming region 11, columnar metal layers 15b long in section having major axes in the X direction, columnar metal layers 15c long in section having major axes in the Y direction, a columnar metal layer 15d having a substantial square shape in section, a metal layer 15e embedded between the metal layers 15b or between the metal layers 15b and 15d, a metal layer 15f embedded between the metal layers 15c or between the metal layers 15c and 15d, and a metal layer 15g embedded to surround the metal layers 15 and 15a to 15f are formed.

In this way, it is seen that the metal layers 15b to 15f are formed to continue to arrays formed by the metal layers 15 and 15a and the metal layer 15g is formed to surround the metal layers 15b to 15f. Because the metal layer 15g is connected to the metal layers 15e and 15f to surround the arrays, the metal layer 15g causes short circuit. Therefore, to prevent the short circuit, it is necessary to remove the metal layer 15g and perform end treatment outside of the arrays.

Therefore, to remove the metal layer 15g formed outside of the arrays, lithography is performed. To perform the lithography, the inside of the arrays is covered by a resist that includes the memory cell array forming region 11 (FIG. 3) and, as shown in FIG. 11, a resist end 17 of which traverses the major axes of the meal layers 15b and 15c. The other region is opened. This can provide a margin for positional deviation of the lithography. The resist end 17 traverses the metal layers 15b and 15c in the same manner even if slight positional deviation occurs.

The metal material is etched with this resist as a mask. This makes it possible to remove the metal layer 15g formed to surround the arrays. Therefore, short circuit does not occur.

Subsequently, the sidewall film 14 including the silicon nitride film is removed by the RIE method or the boiling with phosphoric acid (FIG. 12). The metal oxide film 4 and the polysilicon film 3 as bases are etched with the metal layers 15 as hard masks (FIG. 13).

According to the method explained above, pillars (columnar structures) 30, 30a, and 30b as ReRAM elements with diodes arrayed at high density can be formed (FIG. 13). In FIG. 13, the pillar 30 is formed with the metal layer 15 as a mask, the pillar 30a is formed with the metal layer 15a as a mask, and the pillar 30b is formed with the metal layer 15b, which is removed on the outer side of the resist end 17, as a mask. The length in the X direction of the pillar 30b is larger than the length in the X direction of the pillars 30 and 30a according to the long dimension of the metal layer 15b and the arrangement of the resist end 17.

The pillars 30 and 30a are memory cells in the memory cell array region 11. A space (a pitch) between the pillars 30 and 30a is d/√2, which is a space (a pitch) between the metal layers 15 and 15a (FIG. 11). It is seen that an array can be formed at high density exceeding the lithograph limit.

Further, an oxide film is embedded among the pillars 30, 30a, and 30b by the high density plasma (HDP)-chemical vapor deposition (CVD) method or the like, bit lines are formed to be orthogonal to the word lines 2, and vias for connecting the wires are formed to create a ReRAM device (FIGS. 1 and 2).

For comparison, it is assumed that the resists 8 and 9 shown in FIG. 3 are formed in the same size and the same shape as the resists 7. In this case, in FIGS. 9 and 10, the metal layers 15b and 15d are replaced with the metal layers 15 and the metal layers 15e and 15f are replaced with the metal layers 15a. As in FIG. 9, the metal layer 15g is formed in the outermost periphery outside of the arrays. Therefore, it is necessary to remove the metal layer 15g and prevent short circuit. Therefore, in the lithography, the resist end is arranged between the metal layers 15 at the array end to remove the metal layer 15g. However, because the space between the metal layers 15 is small, in some case, the resist end is not arranged between the metal layers 15 and is placed on the metal layers 15 outside of the memory cell array forming region 11 because of positional deviation. In such a case, the metal layers 15 are partially cut and left by the lithography. When pillars are formed with the metal layers 15, which are partially cut in this way, as a mask, it is likely that the pillars tend to peel and lie as dust.

In this embodiment, the columnar members (the second columnar members and the third columnar members) long in section having the major axes longer than the diameter of the resists 7 are formed at the end of the memory cell arrays, the metal layers 15b and 15c are formed based on the columnar members, and the resist end 17 traverses the metal layers 15b and 15c. Therefore, the length in the array direction of the pillar 30b is secured. Consequently, the likelihood of collapse of the pillar 30b is reduced and the formation of dust is suppressed. Further, because the metal layer 15g is removed, occurrence of short circuit can be prevented.

The length of the major axes of the sections of the metal layers 15b and 15c is desirably larger than the double of the diameter of the resists 7. If the metal layers 15b and 15c and the like are formed in this way and the resist end is arranged to traverse near the centers of the major axes, the length in the X direction of the pillar 30b is at least about the same as the diameter of the pillar 30. Therefore, the pillar 30b does not tend to collapse.

According to this embodiment, the memory cell arrays in which the pillars 30 and 30a are arrayed at high density (the space of d/√2) exceeding the lithography limit can be formed.

The arrangement of the resists 7 is not limited to the arrangement shown in FIG. 3. The resists 7 only have to be arranged in a lattice shape in which the resists 7 are arrayed at substantially equal intervals in the first direction and the second direction crossing the first direction. For example, the formation of the resists 7 in the positions on the face centers in FIG. 3 can be omitted. Concerning at least arrays (distances from which to the edge of the memory cell array forming region 11 are not shorter than those of the other arrays) as a part of the arrays of the first columnar members in the X direction, the second columnar members long in section only have to be formed. Concerning arrays (distances from which to the edge of the memory cell array forming region 11 are not shorter than those of the other arrays) as a part of the arrays of the first columnar members in the Y direction, the third columnar members long in section only have to be formed.

The fourth columnar members having a substantial square shape in section is formed outside of the memory cell array forming region 11 to be opposed to the corners of the memory cell array forming region 11. This makes it possible to prevent the second or third columnar members closest to the corners from spreading in the Y direction or the X direction during the lithography and the etching because of irregularity of patterned arrays. Further, it is possible to prevent the metal layers 15e and 15f, which should be formed by being embedded in the hollows having the groove shape, from spreading in the X direction and the Y direction near the corners because of the same reason.

Figure 14:
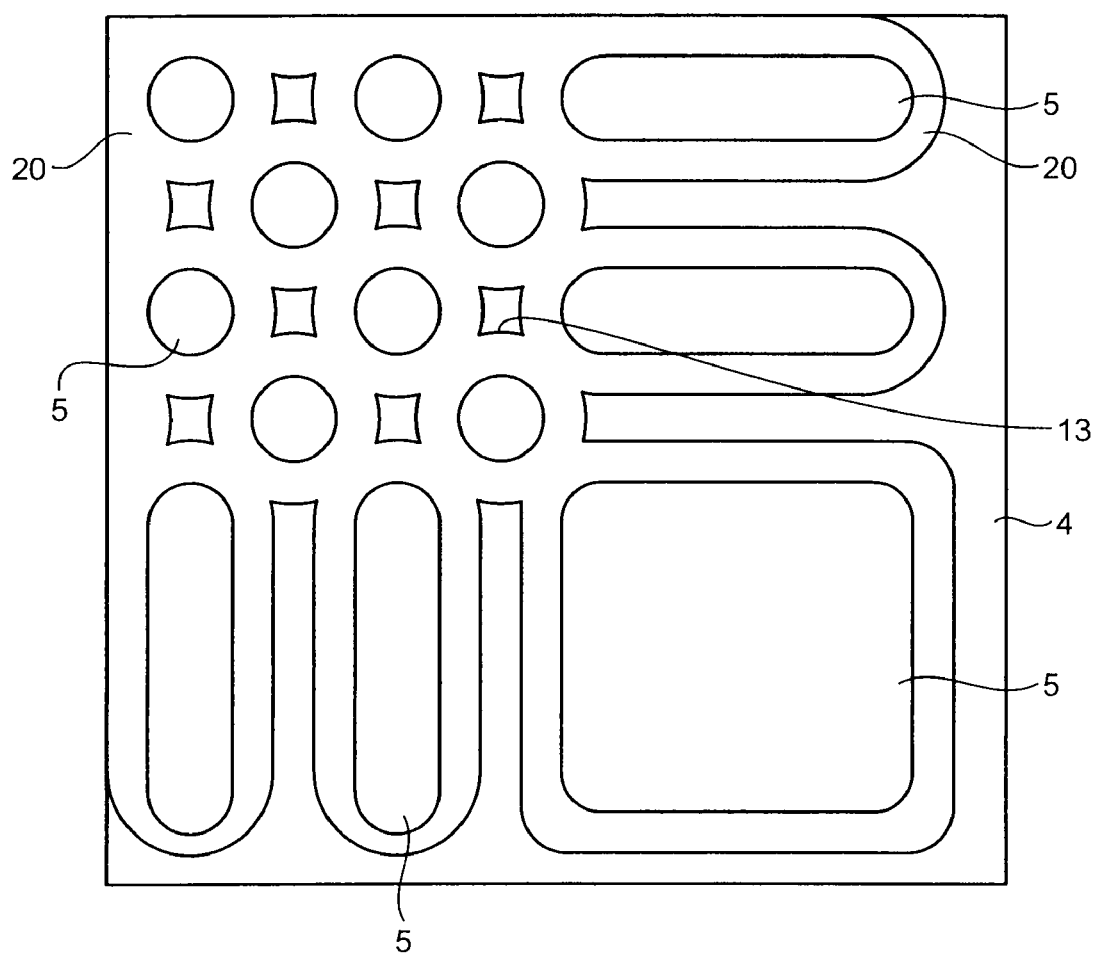
FIG. 14 is a top view of a manufacturing process following FIG. 5 according to a second embodiment of the present invention.
Figure 15:
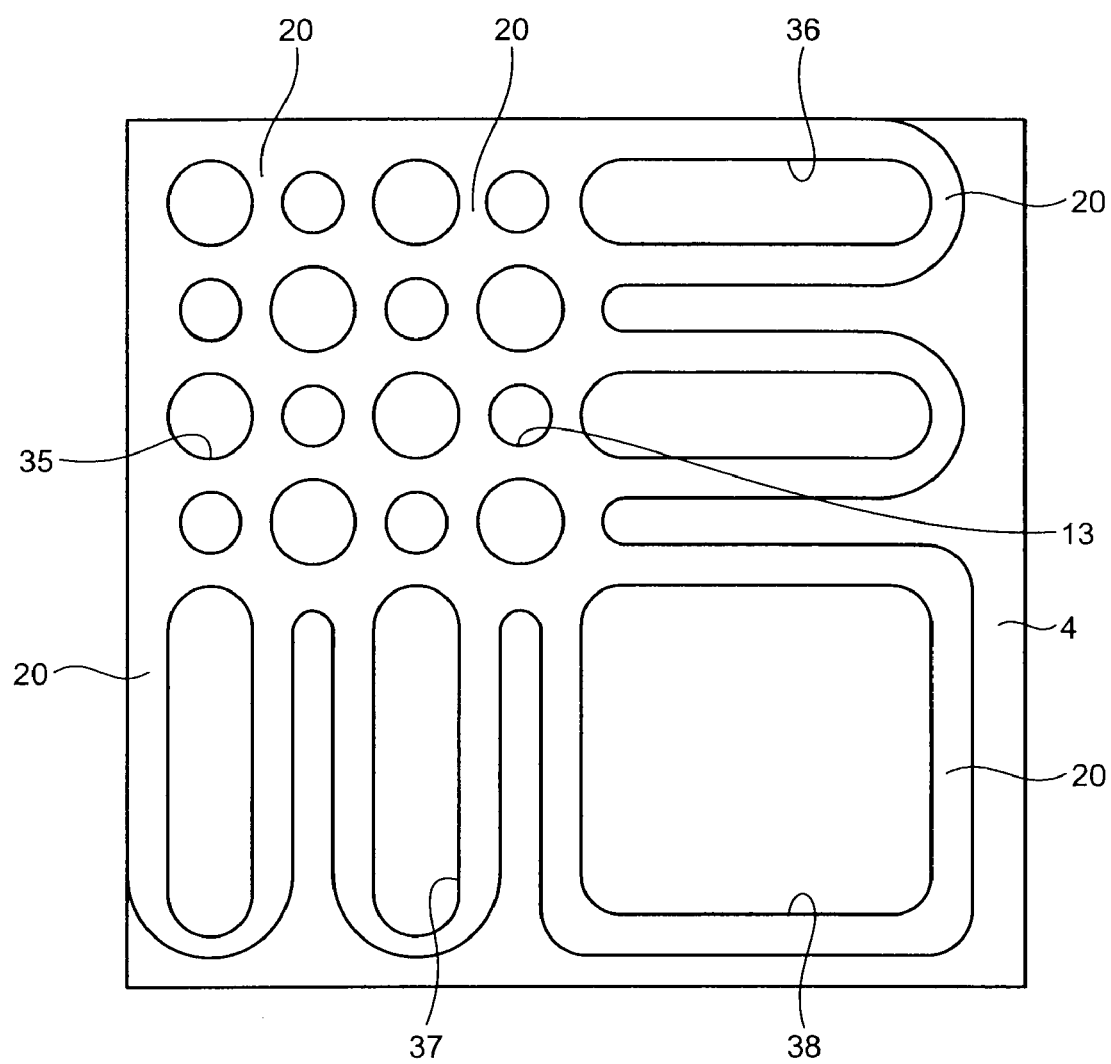
FIG. 15 is a top view of the manufacturing process following FIG. 14.

In a second embodiment of the present invention, the shape of the hollows 13 is rounded. Specifically, a sidewall material is caused to reflow to round off edges of the hollows 13. FIG. 14 is a top view of a manufacturing process following FIG. 5 according to this embodiment. FIG. 15 is a top view of the manufacturing process following FIG. 14.

As in the first embodiment, the manufacturing process for the ReRAM of the cross-point type including diodes is explained in detail below as an example. First, a group of transistors are formed on a semiconductor substrate according to a publicly-known method. Wires of the transistors are formed in a layer on the transistors.

Subsequently, in FIG. 4, the inter-layer insulating film 1 is deposited on the wires. The word lines 2 are formed on the inter-layer insulating film 1 in the publicly-known damascene process. The polysilicon film 3 as a diode is deposited on the inter-layer insulating film 1 on which the word lines 2 are formed. Further, the metal oxide film 4 as a material of variable resistance elements is deposited on the polysilicon film 3. The APF 5 and the silicon nitride film 6 as mask materials are deposited on the metal oxide film 4 in this order. The lithography is performed. The resists 7 to 10 are formed on the silicon nitride film 6 (FIGS. 3 and 4). The silicon nitride film 6 and the APF 5 are removed by the RIE method with the resists 7 to 10 as masks. The silicon nitride film 6 on the APF 5 is removed by the boiling with, for example, phosphoric acid (FIGS. 5 and 6). This step is hereinafter referred to as "silicon nitride film removal"). These steps are the same as those in the first embodiment.

In this embodiment, a silicon oxide film doped with any one of boron and phosphor or both is deposited for a sidewall rather than the silicon nitride film. A sidewall film 20 including the silicon oxide film is left only on the sidewalls of the APF 5 as core materials by a publicly-known method, i.e., etch-back (FIG. 14). In FIG. 14, as in FIG. 7, sharp edges are formed at the four corners of the hollows 13.

The APF 5 are removed by the ashing. Subsequently, in this embodiment, the sidewall film 20 including the doped silicon oxide film is caused to reflow under high temperature (e.g., about 800° C. and in a range of about 700 to 1000° C.). As a result, the edges of the hollows 13 are rounded off (FIG. 15). In FIG. 15, holes 35, 36, 37, and 38 are formed by removing the first to fourth columnar members explained in the first embodiment. Subsequently, in places where the APFs 5 are removed (the holes 35, 36, 37, and 38) and the hollows 13, after barrier metal films of titanium nitride (TiN) or the like are formed, a metal material such as tungsten (W) is embedded to form the metal layers 15 as embedded layers. Further, upper surfaces of the metal layers 15 are planarized by the chemical mechanical polishing (CMP) (FIG. 10). Thereafter, A ReRAM device is manufactured in the same manner as the first embodiment.

According to this embodiment, the edges of the hollows 13 are rounded off by causing the sidewall film 20 to reflow. Therefore, nonuniformity does not occur in electric characteristics of pillars formed by using the hollows 13.

In a third embodiment of the present invention, another method is explained to round a shape of the hollows 13. Specifically, the edges of the hollows 13 are rounded off by dissolving a sidewall material with the wet treatment. As in the first embodiment, the manufacturing process for the ReRAM of the cross-point type including diodes is explained in detail below as an example. The manufacturing process is explained with reference to FIGS. 14 and 15 as well. The steps up to "silicon nitride film removal" explained in the second embodiment are the same. Therefore, steps following this step are explained.

A silicon oxide film is deposited as the sidewall film 20 (FIG. 14). Unlike the second embodiment, in this embodiment, the silicon oxide film does not always have to be doped with any one of boron and phosphor or both. Subsequently, as in the second embodiment, the etch-back is performed and the APFs 5 as core materials are removed by the ashing.

In this embodiment, the edges of the sidewall film 20 including the silicon oxide film are rounded by the wet treatment. Specifically, for example, diluted fluoric acid is used. As a result, as in the second embodiment, the edges of the hollows 13 are rounded off as shown in FIG. 15 in top view. Thereafter, a ReRAM device is manufactured in the same manner as the second embodiment.

According to this embodiment, the edges of the hollows 13 are rounded off by subjecting the sidewall film 20 to the wet treatment. Therefore, nonuniformity does not occur in electric characteristics of the pillars formed by using the hollows 13.

In a fourth embodiment of the present invention, after polysilicon is embedded in the hollows 13, the polysilicon is oxidized to round off edges of the polysilicon. As in the first embodiment, the manufacturing process for the ReRAM of the cross-point type including diodes is explained in detail below as an example. The steps up to "silicon nitride film removal" explained in the second embodiment are the same. Therefore, steps following this step are explained.

In this embodiment, as in the first embodiment, a silicon nitride film is deposited for a sidewall. The silicon nitride film is etched back to leave the sidewall film 14 including the silicon nitride film only on the sidewalls of the APFs 5 as core materials by etching back the sidewall film 14 (FIG. 7).

The APF 5 is removed by the ashing. Subsequently, in this embodiment, polysilicon is embedded in places where the core materials (the APFs 5) are removed (holes) and the hollows 13. In other words, in this embodiment, embedded layers are formed by using polysilicon as an embedding material. Thereafter, as in the first embodiment, upper surfaces of the embedded layers are planarized by the CMP as in the first embodiment to leave the polysilicon only in the places where the core materials are removed (the holes) and the hollows 13.

In this embodiment, the sidewall film 14 including the silicon nitride film is removed by using the method such as the RIE or the boiling with phosphoric acid. Further, in this embodiment, the polysilicon is oxidized. The oxidation can be thermal oxidation or plasma oxidation. For example, in the case of the thermal oxidation, the oxidation is performed in oxygen or water vapor atmosphere at temperature of about 700 C.° to 1100° C. in a furnace and about 900° C. to 1100° C. in the in-situ steam generation (ISSG). In the case of the plasma oxidation, the oxidation is performed in oxygen or water vapor atmosphere at temperature of about 200° C. to 600° C. by an apparatus called slot plane antenna (SPA). The ISSG is an apparatus for performing wet oxidation.

Figure 16:
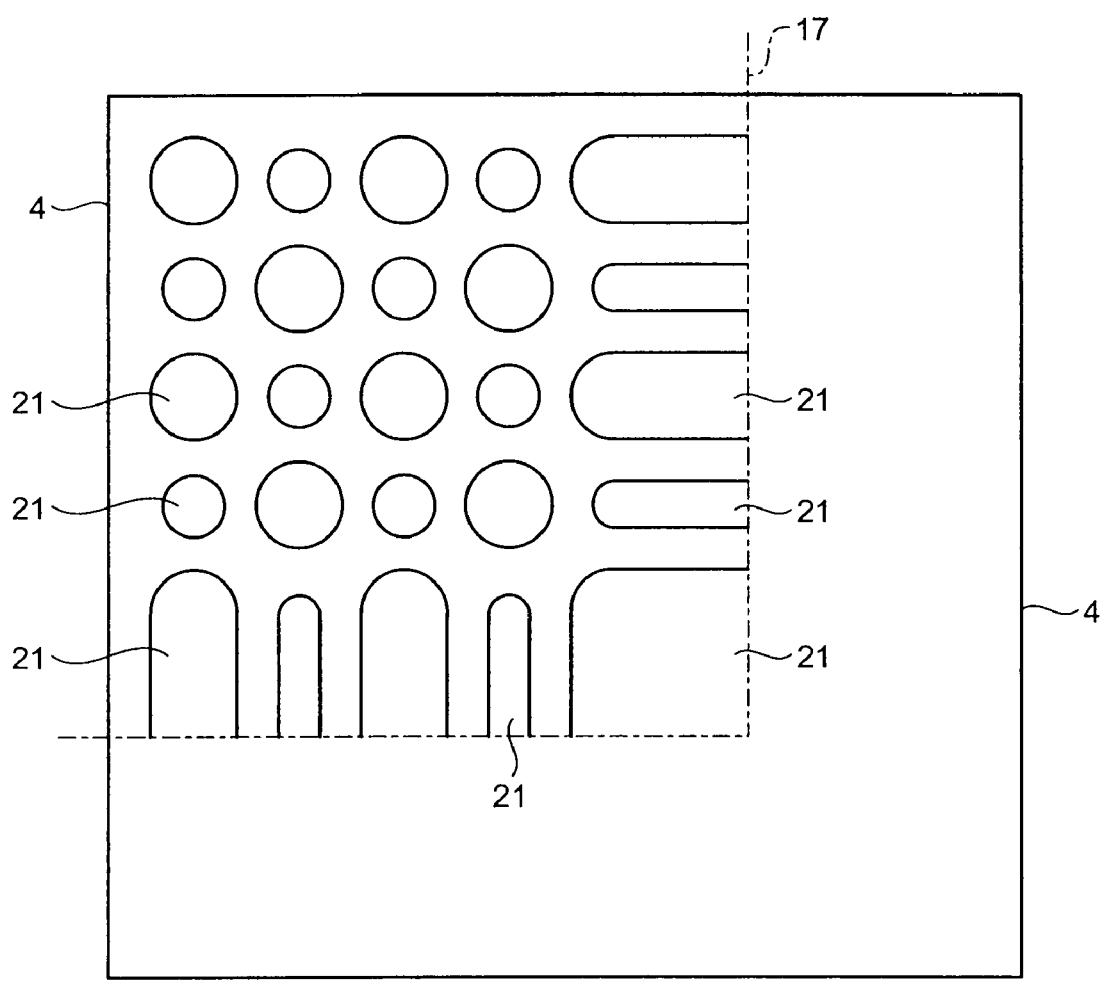
FIG. 16 is a top view of a manufacturing process for a nonvolatile storage device according to a fourth embodiment of the present invention.

An oxidized portion of the polysilicon is dissolved and removed by, for example, diluted fluoric acid. In this way, edges of the polysilicon are rounded off. Thereafter, the resist end 17 is arranged in the same manner as the first embodiment and the polysilicon present in an opening is removed by the lithography. FIG. 16 is a top view of the manufacturing process at this point. It is seen that a polysilicon layer 21 with edges rounded off is formed on the metal oxide film 4.

Subsequently, the metal oxide film 4 and the polysilicon film 3 are etched with the polysilicon layer 21 as a mask. Thereafter, a ReRAM device is manufactured in the same manner as the first embodiment.

In this embodiment, the polysilicon embedded in the hollows 13 is oxidized and the oxidized portion is removed to round off the edges of the polysilicon. Consequently, nonuniformity does not occur in electric characteristics of pillars formed with the polysilicon as a mask.

In a fifth embodiment of the present invention, still another method is adopted to round a shape of the hollows 13. Specifically, a sidewall film itself is oxidized to round off edges of the sidewall film. As in the first embodiment, the manufacturing process for the ReRAM of the cross-point type including diodes is explained in detail below as an example. The steps up to "silicon nitride film removal" explained in the second embodiment are the same. Therefore, steps following this step are explained.

Subsequently, in this embodiment, polysilicon is deposited as a sidewall material for the APFs 5 as core materials. The polysilicon is etched back to form a sidewall film including a polysilicon film only on the sidewalls of the APFs 5.

The APFs 5 are removed by the ashing. Subsequently, in this embodiment, the sidewall film, i.e., the polysilicon film is oxidized. The oxidation can be thermal oxidation or plasma oxidation. For example, in the case of the thermal oxidation, the oxidation is performed in oxygen or water vapor atmosphere at temperature of about 700° C. to 1100° C. in a furnace and about 900° C. to 1100° C. in the in-situ steam generation (ISSG). In the case of the plasma oxidation, the oxidation is performed in oxygen or water vapor atmosphere at temperature of about 200° C. to 600° C. by an apparatus called slot plane antenna (SPA).

An oxidized portion of the sidewall film is dissolved and removed by, for example, diluted fluoric acid. In this way, edges of the hollows 13 are rounded off. Metal layers are embedded in the rounded hollows 13 and holes, from which core materials are removed, to manufacture a ReRAM device in the same manner as the first embodiment. For the removal of the sidewall film from the polysilicon, the RIE method or the wet treatment by alkali liquid such as choline only has to be applied.

According to this embodiment, because the sidewall film is oxidized to remove the oxidized portion, the edges of the hollows 13 are rounded off. Therefore, nonuniformity does not occur in electric characteristics of pillars formed by using the hollows 13.

Broader forms of the present invention are not limited to the specific details and the representative embodiments represented and explained above. Therefore, various modifications are possible without departing from the spirit or the scope of the general concept of the invention defined by the appended claims and their equivalents. For example, in the explanation of the embodiments, the sidewall films are removed after the end treatment outside of the arrays is performed. However, the end treatment can be performed after the sidewall films are removed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a nonvolatile storage device having memory cell arrays in which memory cells are formed at cross points of a plurality of first wires extending in a first direction and a plurality of second wires extending in a second direction crossing the first direction and held between the first wires and the second wires, the method comprising:

forming, in a memory cell array forming region above a processed film, a plurality of first columnar members having a substantial circular shape or a substantial regular polygonal shape in section arrayed at substantially equal intervals in the first direction and the second direction and arranged in a lattice shape, forming, concerning at least arrays as a part of arrays of the first columnar members in the first direction, second columnar members long in section having major axes longer than sections of the first columnar members outside of the memory cell array forming region such that the major axes are set in the first direction and the second columnar members continue to ends of the arrays, and forming, concerning at least arrays as a part of arrays of the first columnar members in the second direction, third columnar members long in section having major axes longer than the sections of the first columnar members outside of the memory cell array forming region such that the major axes are set in the second direction and the third columnar members continue to ends of the arrays;

forming a sidewall film on sidewalls of the columnar members such that hollows are formed in a region surrounded by the columnar members;

selectively removing the columnar members;

embedding an embedding material in holes formed by removing the columnar members and the hollows to form embedded layers;

arranging a resist end to traverse the embedded layers in the holes formed by removing the second and third columnar members, removing the embedded layers on an outer side of the resist end outside of the memory cell array forming region with lithography, and removing the sidewall film; and etching the processed film with the embedded layers as masks to form the memory cells after removing the embedded layers on the outer side and the sidewall film.

2. The method of manufacturing a nonvolatile storage device according to claim 1, wherein the first direction and the second direction are orthogonal to each other, and wherein the first columnar members are formed at least on imaginary square lattice points specified by the first direction and the second direction, the second columnar members are formed concerning arrays having not shorter distances from array ends thereof to one edge of the memory cell forming region opposed to the array ends among arrays of the first columnar members in the first direction, and the third columnar members are formed concerning arrays having not shorter distances from array ends thereof to one edge of the memory cell array forming region opposed to the array ends among arrays of the first columnar members in the second direction.

3. The method of manufacturing a nonvolatile storage device according to claim 2, further comprising forming, in addition to the first to third columnar members, fourth columnar members having a substantial square shape in section outside of the memory cell array forming region to be opposed to corners of the memory cell array forming region.

4. The method of manufacturing a nonvolatile storage device according to claim 3, wherein
length in the first direction of sections of the fourth columnar members is substantially the same as length of the major axes of the sections of the second columnar members, and
length in the second direction of the sections of the fourth columnar members is substantially the same as length of the major axes of sections of the third columnar members.

5. The method of manufacturing a nonvolatile storage device according to claim 3, wherein the first to fourth columnar members are made of amorphous carbon.

6. The method of manufacturing a nonvolatile storage device according to claim 5, further comprising:
laminating amorphous carbon and a silicon nitride film in order above the processed film;
forming a resist having a pattern same as the sections of the first to fourth columnar members above the silicon nitride film; and
etching the silicon nitride film and the amorphous carbon with the resist as a mask, amorphous carbon being processed in a shape corresponding to the pattern by the etching to thereby form the first to fourth columnar members.

7. The method of manufacturing a nonvolatile storage device according to claim 5, wherein forming the sidewall film comprises depositing a silicon nitride film above the processed film above which the columnar members are formed and etching back the silicon nitride film to leave the silicon nitride film as the sidewall film on the sidewalls of the columnar members.

8. The method of manufacturing a nonvolatile storage device according to claim 7, wherein the embedding material includes a metal material.

9. The method of manufacturing a nonvolatile storage device according to claim 7, wherein the embedded layers are formed using polysilicon as the embedding material, and further comprising oxidizing the embedded layers and removing an oxidized portion to thereby round off edges of the embedded layers after removing the sidewall film and before etching the processed film.

10. The method of manufacturing a nonvolatile storage device according to claim 5, further comprising causing the sidewall film to reflow to thereby round off edges of the hollows after selectively removing the columnar members and before forming the embedded layers.

11. The method of manufacturing a nonvolatile storage device according to claim 10, wherein forming the sidewall film comprises depositing a silicon oxide film doped with any one of boron and phosphor or both above the processed film above which the columnar members are formed and etching back the silicon oxide film to leave the silicon oxide film as the sidewall film on the sidewalls of the columnar members.

12. The method of manufacturing a nonvolatile storage device according to claim 5, further comprising applying wet treatment to the sidewall film to thereby round off edges of the hollows after selectively removing the columnar members and before forming the embedded layers.

13. The method of manufacturing a nonvolatile storage device according to claim 12, wherein forming the sidewall film comprises depositing a silicon oxide film above the processed film above which the columnar members are formed and etching back the silicon oxide film to leave the silicon oxide film as the sidewall film on the sidewalls of the columnar members.

14. The method of manufacturing a nonvolatile storage device according to claim 5, further comprising oxidizing the sidewall film and removing an oxidized portion to thereby round off edges of the hollows after selectively removing the columnar members and before forming the embedded layers.

15. The method of manufacturing a nonvolatile storage device according to claim 14, wherein forming the sidewall film comprises depositing a polysilicon film above the processed film above which the columnar members are formed and etching back the polysilicon film to leave the polysilicon film as the sidewall film on the sidewalls of the columnar members.

16. The method of manufacturing a nonvolatile storage device according to claim 1, wherein
the sections of the first columnar members have a substantial circular shape, and
lengths of the major axes of sections of the second and third columnar members are larger than a double of length of a diameter of the sections of the first columnar members.

17. The method of manufacturing a nonvolatile storage device according to claim 16, wherein the sections of the second and third columnar members have a substantial oval shape.

18. The method of manufacturing a nonvolatile storage device according to claim 1, wherein upper surfaces of the embedded layers are planarized by CMP after the embedded layers are formed and before the lithography.

19. The method of manufacturing a nonvolatile storage device according to claim 1, wherein the memory cells are formed by laminating rectifying elements and variable resistance elements.

20. The method of manufacturing a nonvolatile storage device according to claim 19, wherein the processed film includes a polysilicon film and a metal oxide film laminated above the polysilicon film.

* * * * *